United States Patent
Lee et al.

(10) Patent No.: US 11,199,595 B2
(45) Date of Patent: Dec. 14, 2021

(54) RADIO FREQUENCY ATOMIC MAGNETOMETER THROUGH DIFFERENTIAL MAGNETIC FIELD POLARIZATION SELECTION AND OPERATION METHOD THEREOF

(71) Applicant: Electronics and Telecommunications Research Institute, Daejeon (KR)

(72) Inventors: Hyunjoon Lee, Busan (KR); In Kui Cho, Daejeon (KR); Jang Yeol Kim, Daejeon (KR); Jaewoo Lee, Daejeon (KR); Ho Jin Lee, Daejeon (KR); Sang-Won Kim, Daejeon (KR); Seong-Min Kim, Daejeon (KR); Jung Ick Moon, Daejeon (KR); Woo Cheon Park, Daejeon (KR); Je Hoon Yun, Daejeon (KR); Dong Won Jang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/071,530

(22) Filed: Oct. 15, 2020

(65) Prior Publication Data
US 2021/0109173 A1    Apr. 15, 2021

(30) Foreign Application Priority Data

Oct. 15, 2019 (KR) .................. 10-2019-0127908
Sep. 18, 2020 (KR) .................. 10-2020-0120620

(51) Int. Cl.
*G01R 33/26* (2006.01)

(52) U.S. Cl.
CPC .................. *G01R 33/26* (2013.01)

(58) Field of Classification Search
CPC ........ G01R 33/26; G01R 33/24; G01R 33/20; G01N 24/006; G01N 24/00; H01S 3/091; A61B 5/055
See application file for complete search history.

(56) References Cited

U.S. PATENT DOCUMENTS 8,941,377 B2 *  1/2015  Mizutani .............. G01R 33/032
                                            324/244.1
9,360,534 B2 *  6/2016  Nagasaka .......... G01R 33/0322

FOREIGN PATENT DOCUMENTS

DE      102019219055 A1 *  6/2021  ............. G01C 19/62
KR      10-2009-0128735          12/2009

(Continued)

*Primary Examiner* — Jay Patidar
(74) *Attorney, Agent, or Firm* — Kile Park Reed & Houtteman PLLC

(57) ABSTRACT

The atomic magnetometer includes a light source device configured to output a linearly polarized irradiation light and a circularly polarized pump light, a first vapor cell including an alkali metal atom, receiving the linearly polarized irradiation light, and outputting a first transmitted light, a second vapor cell including an alkali metal atom, receiving the linearly polarized irradiation light, and outputting a second transmitted light, a magnetic field application device configured to apply a bias magnetic field in opposite directions to the first vapor cell and the second vapor cell, and a measuring device configured to obtain the magnetic field signal based on a differentiation of a first polarization rotation signal corresponding to a polarization state of the first transmitted light and a second polarization rotation signal corresponding to a polarization state of the second transmitted light.

18 Claims, 5 Drawing Sheets

(56) References Cited

FOREIGN PATENT DOCUMENTS

KR  10-2016-0048568  5/2016
KR  10-1624482  5/2016

* cited by examiner

RADIO FREQUENCY ATOMIC MAGNETOMETER THROUGH DIFFERENTIAL MAGNETIC FIELD POLARIZATION SELECTION AND OPERATION METHOD THEREOF

CROSS-REFERENCE TO RELATED APPLICATION(S)

This application claims the benefit of Korean Patent Application No. 10-2019-0127908, filed on Oct. 15, 2019, and Korean Patent Application No. 10-2020-0120620 filed on Sep. 18, 2020, in the Korean Intellectual Property Office, the entire disclosures of which are incorporated herein by reference for all purposes.

BACKGROUND

1. Field of the Invention

The present disclosure relates to a radio frequency atomic magnetometer through a differential magnetic field polarization selection and an operation method thereof.

2. Description of the Related Art

An atomic magnetometer or an optical magnetometer may measure a magnetic field signal to be measured through an interaction between light and an atom resonating therein under a magnetic field. Atoms that make up the atomic magnetometer may be atoms of which magnetic moment is not zero. When electrons are under an external magnetic field, they may precess around the magnetic field. A frequency of the precession may be proportional to the external magnetic field, and the value is called a Larmor frequency. Ultimately, the atomic magnetometer may measure the magnetic field by measuring the Larmor frequency of an electron under the external magnetic field.

A sensitivity of the atomic magnetometer may be determined by a line width and magnetic noise of the measured magnetic field signal. The line width of the magnetic field may be inversely proportional to a time that a magnetization or coherence of an atomic medium is maintained. Thus, to improve the sensitivity of the atomic magnetometer, it may be necessary to increase the magnetization or coherence time or cancel the magnetic noise.

Recently, a spin exchange relaxation free (SERF) method that completely eliminates a mitigating relaxation of spin exchange collision between floor levels is known. In the SERF method, if the Larmor frequency is much smaller than a rate of the spin exchange collision between atoms under a weak magnetic field of several nanoteslas (nT), the relaxation due to the spin exchange may be effectively reduced. In this configuration, the precession motion of each atom is in the same phase, and the precession frequency may become relatively slower than a general Larmor frequency.

However, a typical SERF atomic magnetometer may have a long magnetization or coherence retention time (that is, a narrow line width in a frequency domain). For this reason, a measurement frequency band is limited to within approximately 150 hertz (Hz), and a signal changing faster than that may be distorted or not be fully measured. Also, since an absolute zero magnetic field is required in an operating environment, it may be highly affected by environmental noise such as vibration noise and power supply noise.

Meanwhile, an expected effect of communication technology using the magnetic field signal is increasing recently. Communication and location tracking technology is basically based on generation, transmission, and reception of radio wave signals. In some cases, the radio wave signal may be distorted or attenuated between a transmitter and a receiver, so that signal transmission is not smoothly performed. In particular, a magnetic signal in a very low frequency (VLF) band is required to perform the communication and location tracking technology in a situation in which signal attenuation is apparently observed.

The magnetic field is one of the most fundamental and observable physical quantities, and carries information about all electromagnetic phenomena. However, since a low-frequency magnetic field has a dipole characteristic and a transmission strength is attenuated by a cube of distance, a signal measurement range based on a distance may decrease rapidly. Also, in addition to the magnetic signal, external magnetic noise including the earth's magnetic field is an obstacle to a development of magnetic field communication technology.

In a related art, a typical magnetic field measuring device may have a gradiometer to cancel the external magnetic noise. The gradiometer may measure the magnetic field by differentiating signals measured by magnetic field measuring devices arranged at different locations and canceling the external magnetic noise. However, in magnetic field communication, a distance between a magnetic signal source and the magnetic field measuring device may be several hundred meters (m) and a distance between the magnetic field measuring devices may be within several tens of centimeters (cm), so a significant attenuation of the magnetic field signal may not be observed between the magnetic field measuring devices.

When the magnetic field measuring devices differentiate signals with only a few tens of centimeters apart, not only the external magnetic noise but also the magnetic field signal to be measured may be removed. Therefore, a typical gradiometer may not be used for the development and application of the magnetic communication technology. External magnetic noise cancellation technology is important in the development of the magnetic field communication technology. Accordingly, there is a desire for developing a new method of canceling external magnetic noise.

SUMMARY

An aspect provides a magnetic field polarization selection measurement technology for measuring a magnetic field signal by differentiating transmitted light output from vapor cells.

Another aspect also provides a magnetic sensor that has a magnetic sensitivity required for development of communication technology using a magnetic field and effectively cancels external magnetic noise.

Technical goals to be achieved by the present disclosure are not limited to the above-described technical tasks, and other technical tasks may exist.

According to an aspect, there is provided an atomic magnetometer for measuring a magnetic field signal, the atomic magnetometer including a light source device configured to output a linearly polarized irradiation light and a circularly polarized pump light, a first vapor cell including an alkali metal atom magnetically polarized by the circularly polarized pump light, receiving the linearly polarized irradiation light, and outputting a first transmitted light, a second vapor cell including an alkali metal atom magnetically polarized by the circularly polarized pump light, receiving the linearly polarized irradiation light, and outputting a second transmitted light, a magnetic field application device configured to apply a bias magnetic field in opposite directions to the first vapor cell and the second vapor cell, and a measuring device configured to obtain the magnetic field signal based on a differentiation of a first polarization rotation signal corresponding to a polarization state of the first transmitted light and a second polarization rotation signal corresponding to a polarization state of the second transmitted light.

The light source device may include a pump light source configured to output the circularly polarized pump light and an irradiation light source configured to output the linearly polarized irradiation light.

The alkali metal atom may be any one of potassium (K), rubidium (Rb), and cesium (Cs).

The first vapor cell and the second vapor cell may further contain a buffer gas.

The buffer gas may be a quenching gas using any one of helium (He), xenon (Xe), and nitrogen (N).

The atomic magnetometer may further include a first temperature adjustment device configured to adjust a temperature of the first vapor cell and located outside the first vapor cell, and a second temperature adjustment device configured to adjust a temperature of the second vapor cell and located outside the second vapor cell.

The magnetic field application device may include a pair of first bias magnetic field generating coils located on both sides of the first vapor cell to apply a bias magnetic field to the first vapor cell, a pair of second bias magnetic field generating coils located on both sides of the second vapor cell to apply a bias magnetic field to the second vapor cell, and a bias magnetic field controller configured to control magnetic fields generated by the pair of first bias magnetic field generating coils and the pair of second bias magnetic field generating coils.

A direction of the bias magnetic field may be parallel to a magnetic polarization direction of the alkali metal atom.

The magnetic field signal may be circularly polarized and output in an antenna.

According to another aspect, there is also provided an operation method of an atomic magnetometer for measuring a magnetic field signal, the method including optically pumping alkali metal atoms by providing a circularly polarized pump light to a first vapor cell and a second vapor cell including the alkali metal atoms, applying a bias magnetic field in opposite directions to the first vapor cell and the second vapor cell including the optically pumped alkali metal atoms, providing a linearly polarized irradiation light to the first vapor cell and the second vapor cell to which the bias magnetic field is applied, detecting a first polarization rotation signal based on a polarization state of a first transmitted light output by the first vapor cell provided with the linearly polarized irradiation light, detecting a second polarization rotation signal based on a polarization state of a second transmitted light output by the second vapor cell provided with the linearly polarized irradiation light, and obtaining the magnetic field signal based on a differentiation of the first polarization rotation signal and the second polarization rotation signal.

The optically pumping may include providing a circularly polarized pump light to the first vapor cell and the second vapor cell through a pump light source, and the providing of the irradiation light may include providing a linearly polarized irradiation light to the first vapor cell and the second vapor cell to which the bias magnetic field is applied through an irradiation light source.

The alkali metal atoms may be any one of potassium (K), rubidium (Rb), and cesium (Cs).

The first vapor cell and the second vapor cell may further contain a buffer gas.

The buffer gas may be a quenching gas using any one of helium (He), xenon (Xe), and nitrogen (N).

The operation method may further include adjusting a temperature of the first vapor cell through a first temperature adjustment device located outside the first vapor cell, and adjusting a temperature of the second vapor cell through a second temperature adjustment device located outside the second vapor cell.

The applying of the bias magnetic field may include controlling, through a bias magnetic field controller, magnetic fields generated by a pair of first bias magnetic field generating coils located on both sides of the first vapor cell and a pair of second bias magnetic field generating coils located on both sides of the second vapor cell.

A direction of the bias magnetic field may be parallel to a magnetic polarization direction of the alkali metal atoms.

The magnetic field signal may be circularly polarized and output in an antenna.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
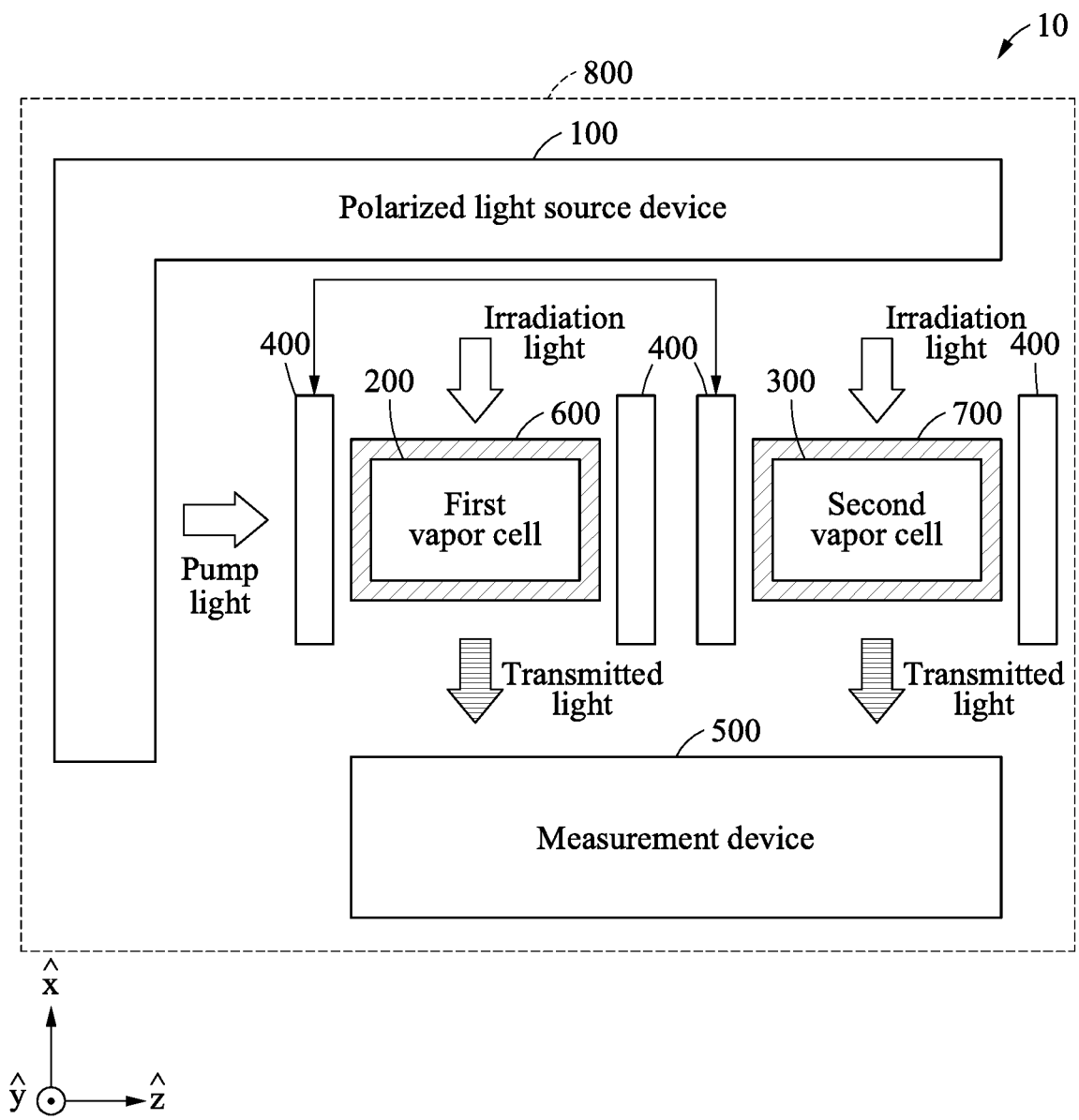
FIG. 1 is a diagram illustrating an atomic magnetometer according to an example embodiment.

Hereinafter, example embodiments will be described in detail with reference to the accompanying drawings. It should be understood, however, that there is no intent to limit this disclosure to the particular example embodiments disclosed. On the contrary, example embodiments are to cover all modifications, equivalents, and alternatives falling within the scope of the example embodiments.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

In addition, terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

A component having a common function with a component included in one example embodiment is described using a like name in another example embodiment. Unless otherwise described, a description made in one example embodiment may be applicable to another example embodiment and a detailed description within a duplicate range is omitted.

FIG. 1 is a diagram illustrating an atomic magnetometer according to an example embodiment.

An atomic magnetometer 10 may include a polarized light source device 100, a first vapor cell 200, a second vapor cell 300, a magnetic field applying device 400, and a measurement device 500. The atomic magnetometer 10 may further include a first temperature adjustment device 600, a second temperature adjustment device 700, and a magnetic shielding part 800.

The atomic magnetometer 10 may measure a strength and a direction of a radio frequency (RF) magnetic field by measuring an interaction between an atom and light through a magnetic polarization or a spin precession of the atom changed by the RF magnetic field. The atomic magnetometer 10 may overcome a limitation of an existing position-dependent gradiometer in utilizing this to a magnetic communication technology.

The atomic magnetometer 10 may selectively measure a polarization of a magnetic field by adjusting the strength and the direction of the bias magnetic field. A magnetic field signal to be measured may be generated in an antenna. A distance between the antenna and the atomic magnetometer 10 may be about 30 meters (m) to 300 m. The magnetic signal may be circularly polarized and output from the antenna. A rotation direction of a circularly polarized light may be a clockwise direction or a counterclockwise direction.

The atomic magnetometer 10 may measure a magnetic signal having the same frequency as a Larmor frequency of an atom under a bias magnetic field based on a magnetic resonance phenomenon. For example, to describe a spin motion of the atom, a rotational coordinate system may be used so that the spin of the atom that precesses by the bias magnetic field is represented in the coordinate system rotating at the corresponding Larmor frequency. In this case, the spin motion of the atom may be statically described. In this example, magnetization of the atom may be formed by a pump light based on a quantum axis (e.g., a z axis of FIG. 1). Also, when an external magnetic signal corresponding to the Larmor frequency is applied to a direction vertical to the z axis, atomic magnetic polarization (magnetization) in a static state may rotate to an x-y plane. This may be a phase change of magnetization due to the magnetic resonance. The phase change of magnetization due to the magnetic resonance may cause a change in density between energy states of the atom and result in the polarization of an irradiation light being rotated in proportion to the magnetic field. Accordingly, the atomic magnetometer 10 may observe the change in the magnetic field by measuring a polarization rotation angle of a transmitted light.

The measurement frequency bandwidth of the atomic magnetometer 10 may be determined by Zeeman splitting and hyperfine splitting, and a determined value may range mainly from several kilohertz (kHz) to several megahertz (MHz). Such RF band may be relatively unaffected by vibration noise or power supply noise in a low frequency band. Thus, the atomic magnetometer 10 may overcome disadvantages of a typical (spin-exchange relaxation free (SERF) atomic magnetometer.

In addition, a magnetic sensitivity of a general RF atomic magnetometer may be higher than or equal to a magnetic sensitivity of the SERF atomic magnetometer. However, a general noise level of the atomic magnetometer 10 may range from several $pT/Hz^{1/2}$ to several $fT/Hz^{1/2}$ and thus, be suitable for magnetic field communication technology development and application using a magnetic field of the corresponding frequency band. That is, in the communication technology development using the magnetic field, a frequency bandwidth of a magnetic field to be used as a magnetic signal may be a low frequency signal of several kHz to hundreds of kHz. Since the low frequency magnetic field has a dipole characteristic and a transmission strength is attenuated by a cube of a distance, a signal measurement range based on the distance may decrease rapidly. Therefore, a magnetic sensor having a magnetic sensitivity required for the communication technology development using the magnetic field may be provided through the atomic magnetometer 10.

The atomic magnetometer 10 may use a magnetic field polarization selection measurement method to measure an accurate magnetic signal. The magnetic field polarization selection measurement method may be a method using a principle that a precession phase of an atom changes based on a direction of the bias magnetic field applied to the RF atomic magnetometer and a polarization rotation direction of a circularly polarized pump light. For example, a polarization of the pump light is a right-circular polarization ($\sigma^+$) and a magnetic signal of the circular polarization may be measured. In this example, when the direction of the bias magnetic field is a z direction, an atomic spin may precess in a counterclockwise direction on the x-y plane. Conversely, when the direction of the bias magnetic field is a −z direction, the atomic spin may precess in a clockwise direction on the x-y plane. However, a magnetic signal of an RF to be measured may no longer be described in a static state on the above-described rotation coordinate system, a magnetic resonance signal may not be observed. Thus, the atomic magnetometer 10 may apply the bias magnetic field in opposite directions to two or more aligned atomic vapor cells, and then subtract a measured signal from two signals, so that only a circularly polarized magnetic field signal from which background magnetic noise has been canceled is measured. Furthermore, when a polarization of the pump light is the right-circular polarization ($\sigma^+$) and a magnetic signal of a linear polarization is measured, since the linearly polarized magnetic signal is a sum of right and left circularly polarized signals, precession may occur in opposite rotation directions based on the direction of the bias magnetic field. In this case, subtracting the measured signal from each vapor cell may result in no signal being obtained. This, considering the above two cases, the atomic magnetometer 10 may obtain only a circularly polarized magnetic field signal in which background noise has been canceled. Magnetic signals naturally or artificially generated in a domain having a frequency bandwidth of several kHz to hundreds of kHz may be mostly linearly polarized magnetic field signals. In addition, when the circularly polarized magnetic signal is reflected by an obstacle, a phase of the signal may be changed by 90 degrees (°). Accordingly, the atomic magnetometer 10 may remove not only a magnetic field signal that is not desired to be measured, but also a reflected and distorted magnetic field signal.

The polarized light source device 100 may output an irradiation light and a pump light. The polarized light source device 100 may provide the irradiation light and the pump light to the first vapor cell 200 and the second vapor cell 300.

The first vapor cell 200 may be provided with the irradiation light to output a first transmitted light.

The second vapor cell 300 may be provided with the irradiation light to output a second transmitted light.

The magnetic field applying device 400 may apply the bias magnetic field in opposite directions to the first vapor cell 200 and the second vapor cell 300. The magnetic field applying device 400 may apply the bias magnetic field to the first vapor cell 200 and the second vapor cell 300, thereby adjusting a magnetic resonance frequency or a Larmor frequency of alkali metal atoms included in the first vapor cell 200 and the second vapor cell 300.

The measurement device 500 may measure a change in magnetic polarization or magnetization of an alkali metal atom affected by a circularly polarized magnetic field signal applied from an external source.

The measurement device 500 may detect a first polarization rotation signal based on a polarization state of the first transmitted light. The measurement device 500 may detect a second polarization rotation signal based on a polarization state of the second transmitted light. The measurement device 500 may obtain the magnetic field signal based on a differentiation of the first polarization rotation signal and the second polarization rotation signal.

The first temperature adjustment device 600 may be located outside the first vapor cell 200. The first temperature adjustment device 600 may be implemented as an oven structure. The first temperature adjustment device 600 may adjust a temperature of the first vapor cell 200.

The second temperature adjustment device 700 may be located outside the second vapor cell 300. The second temperature adjustment device 700 may be implemented as an oven structure. The second temperature adjustment device 700 may adjust a temperature of the second vapor cell 300.

The magnetic shielding part 800 may be a passive magnetic shielding means formed of a soft magnetically such as Mu-metal or implemented as an active magnetic shielding means including a set of coils.

When the magnetic shielding part 800 is implemented as the passive magnetic shielding means, the magnetic shielding part 800 may be implemented as a magnetic body located around the first and second vapor cells 200 and 300 to reduce an external environmental magnetic field. The magnetic shielding part 800 may be implemented to include a plurality of layers of cylindrical Mu-metal chambers surrounding the first and second vapor cells 200 and 300. Mu-metal may be a nickel-iron alloy. The Mu-metal chamber may minimize an effect of an external magnetic field including the earth's magnetic field.

When the magnetic shielding part 800 is implemented as the active magnetic shielding means, an active magnetic shielding technique may be applied. A magnetic field compensation part (not shown) included in the magnetic shielding part 800 may be disposed around the first and second vapor cells 200 and 300 and generate a canceling magnetic field to remove the external environmental magnetic field or a residual magnetic field remaining after a removal.

Figure 2:
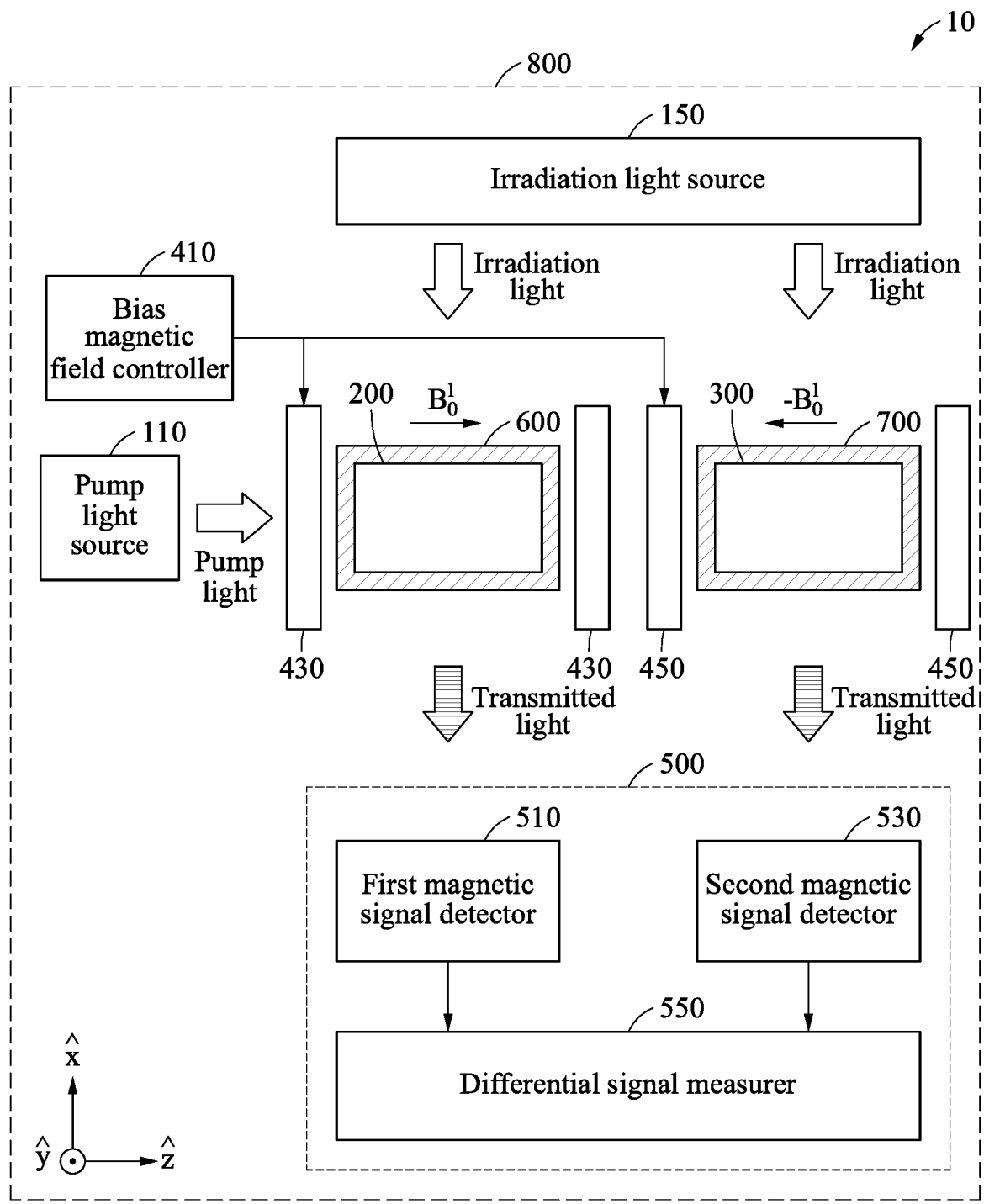
FIG. 2 is a diagram illustrating the atomic magnetometer of FIG. 1.

FIG. 2 is a diagram illustrating an atomic magnetometer of FIG. 1.

The polarized light source device 100 may include a pump light source 110 and an irradiation light source 150.

The pump light source 110 may provide a circularly polarized pump light to the first vapor cell 200 and the second vapor cell 300. The pump light source 110 may optically pump alkali metal atoms included in the first vapor cell 200 and the second vapor cell 300 by providing the circularly polarized pump light to the first vapor cell 200 and the second vapor cell 300. For example, the pump light source 110 may include an external cavity diode laser (ECDL).

The pump light source 110 may provide the circularly polarized pump light to the first vapor cell 200 and the second vapor cell 300 through a polarization maintaining fiber of a single mode TEM00. A wavelength of the pump light source 110 may coincide with a center of a line D1 of the alkali metal atom. Power of the pump light output from the pump light source 110 may be amplified up to 1 watt (W) by a tapered amplifier, and a diameter of light may extend up to several tens of millimeters (mm) through a pair of lenses. An extended width of the light may depend on a size of a vapor cell. The pump light output from the pump light source 110 may be promoted in a z-axial direction.

When a predetermined light is radiated to the first vapor cell 200 and the second vapor cell 300 by the pump light output from the pump light source 110, alkali metal atomic vapors in the first vapor cell 200 and the second vapor cell 300 may absorb a circularly polarized light of a predetermined wavelength according to a quantum mechanical selection rule. The alkali metal atoms may be driven into a single quantum state through continuous absorption and re-emission of the circularly polarized light of the predetermined wavelength. That is, the alkali metal atoms may be optically pumped to form atomic polarization (magnetization) with respect to a quantum axis having the same direction as a promotion direction of the pump light. A direction of the magnetic polarization of the alkali metal atoms may be the z-axial direction.

The irradiation light source 150 may provide a linearly polarized irradiation light to the first vapor cell 200 and the second vapor cell 300. For example, an irradiation light output from the irradiation light source 150 may be generated by passing a portion of the pump light or an external resonant semiconductor laser through an optical modulator. A wavelength of the irradiation light output from the irradiation light source 150 may be monitored by a saturation absorption spectrometer (not shown) and a spectrometer (not shown). The irradiation light output from the irradiation light source 150 may be promoted in an x-axial direction and provided to the first vapor cell 200 and the second vapor cell 300. The wavelength of the irradiation light output from the irradiation light source 150 may be maintained at several nanometers (nm) away from a line D2 of an alkali-group metal atom to minimize absorption.

The irradiation light source 150 may provide the linearly polarized irradiation light to the first vapor cell 200 and the second vapor cell 300 through a polarization maintaining fiber of a single mode TEM00. The irradiation light source 150 may further include a ½ waveplate (not shown). The ½ veplate (not shown) may change a direction of linear polarization. The irradiation light passing through the ½ veplate (not shown) may be provided to the first vapor cell 200 and the second vapor cell 300 in the x-axial direction.

The first vapor cell 200 may be provided with the linearly polarized irradiation light to output the first transmitted light. The first vapor cell 200 may contain alkali metal atoms that are magnetically polarized by the pump light. For example, the alkali metal atom may be any one of potassium (K), rubidium (Rb), and cesium (Cs).

The first vapor cell 200 may further contain a buffer gas. For example, the buffer gas may be a quenching gas using any one of helium (He), xenon (Xe), and nitrogen (N). When the first vapor cell 200 contains the buffer gas, the sensitivity of the atomic magnetometer 10 may be improved. For example, the buffer gas may improve the sensitivity of the atomic magnetometer 10 by preventing collisions between the alkali metal atoms and a wall of the vapor cell. In general, a factor that has a greatest influence on a coherence time between base circumferences of alkali group atoms may be the collision between the vapor cell wall and the atom. By using any one of helium, xenon, and nitrogen as the buffer gas, a state change of coherence or magnetization may not be affected even if the collision with the alkali group atom occurs. In other words, the buffer gas may prevent a diffusion of the alkali group atom to the vapor cell wall and increase an interaction time between the alkali group atom and the irradiation light.

The second vapor cell 300 may be provided with the linearly polarized irradiation light to output the second transmitted light. The second vapor cell 300 may contain alkali metal atoms that are magnetically polarized by the pump light. For example, the alkali metal atom may be any one of potassium (K), rubidium (Rb), and cesium (Cs).

The second vapor cell 300 may further contain a buffer gas. For example, the buffer gas may be a quenching gas using any one of helium (He), xenon (Xe), and nitrogen (N).

The magnetic field applying device 400 may include a bias magnetic field controller 410, a pair of first bias magnetic field generating coils 430, and a pair of second bias magnetic field generating coils 450.

The bias magnetic field controller 410 may control magnetic fields generated by the pair of first bias magnetic field generating coils 430 and the pair of second bias magnetic field generating coils 450.

The pair of first bias magnetic field generating coils 430 may be located on both sides of the first vapor cell 200. The pair of first bias magnetic field generating coils 430 may apply the bias magnetic field $B_0$ to the first vapor cell 200. A direction in which the pair of first bias magnetic field generating coils 430 apply the bias magnetic field $B_0$ to the first vapor cell 200 may be parallel to a magnetic polarization direction of the alkali metal atom included in the first vapor cell 200.

The pair of second bias magnetic field generating coils 450 may be located on both sides of the second vapor cell 300. The pair of second bias magnetic field generating coils 450 may apply the bias magnetic field $B_0$ to the second vapor cell 300. A direction in which the pair of second bias magnetic field generating coils 450 apply the bias magnetic field $B_0$ to the second vapor cell 300 may be parallel to a magnetic polarization direction of the alkali metal atom included in the second vapor cell 300.

The pair of first bias magnetic field generating coils 430 and the pair of second bias magnetic field generating coils 450 may be implemented as a plurality of coil units that forms a uniform magnetic field. For example, the pair of first bias magnetic field generating coils 430 may be implemented using a Helmholtz coil. The Helmholtz coil may obtain a uniform magnetic field distribution in a large space.

A direction in which the pair of first bias magnetic field generating coils 430 and the pair of second bias magnetic field generating coils 450 apply the bias magnetic fields may be the same or opposite to a direction of the pump light for magnetic polarization selection measurement. The alkali metal atoms included in the first and second vapor cells 200 and 300 may precess by the bias magnetic field based on an axis to which the bias magnetic field is applied. In this instance, each frequency of the precession of the alkali metal atoms may be $\gamma B_0$. $\gamma$ may denote a gyromagnetic ratio of the alkali metal atom. For example, the pair of first bias magnetic field generating coils 430 and the pair of second bias magnetic field generating coils 450 may include a bias magnetic field generating coil connected to the bias magnetic field controller 410 and a bias magnetic field canceling coil to cancel the bias magnetic field.

The measurement device 500 may include a first magnetic signal detector 510, a second magnetic signal detector 530, and a differential signal measurer 550.

The first magnetic signal detector 510 may detect the first polarization rotation signal based on a polarization state of the first transmitted light. The first magnetic signal detector 510 may output the first polarization rotation signal to the differential signal measurer 550.

The second magnetic signal detector 530 may detect the second polarization rotation signal based on a polarization state of the second transmitted light. The second magnetic signal detector 530 may output the second polarization rotation signal to the differential signal measurer 550.

The first and second magnetic signal detectors 510 and 530 may be implemented to include a balanced polarimeter (not shown), thereby detecting the first and second polarization rotation signals. For example, the balanced polarimeter may include a polarized light splitter (not shown), a first photodiode (not shown), a second photodiode (not shown), and a differential amplifier (not shown). The polarized light splitter (not shown) may be implemented as a Wollaston prism that separates light according to a polarization state. An output of the first photodiode and an output of the second photodiode may be provided to the differential amplifier (not shown). Accordingly, an output of the differential amplifier (not shown) may be proportional to a polarization rotation angle.

The differential signal measurer 550 may obtain a magnetic field signal based on a differentiation of the first polarization rotation signal and the second polarization rotation signal.

The first and second temperature adjustment devices 600 and 700 may control a vapor pressure of the alkali metal atoms included in the first and second vapor cells 200 and 300 through heat transfer, hot air circulation, or hot liquid circulation.

For example, the first and second temperature adjustment devices 600 and 700 may include heaters (not shown) to heat the first and second vapor cells 200 and 300. The first and second temperature adjustment devices 600 and 700 may heat the first and second vapor cells 200 and 300 to 40 to 200 degrees Celsius based on a type of the alkali metal atoms included in the first and second vapor cells 200 and 300. The heater (not shown) may be implemented as a Kapton etched heat foil etched on a flexible non-magnetic material. The heater (not shown) may be insulated by a thermal insulating panel. A resistor (not shown) included in the heater (not shown) may be implemented as Constantan. The resistor (not shown) may automatically maintain the predetermined temperature through a feedback control.

The first and second temperature adjustment devices 600 and 700 may control a temperature by applying an alternating current (AC) of 1 MHz to 10 MHz to the resistor (not shown) to generate heat. By the current of the first and second temperature adjustment devices 600 and 700, a magnetic field of 1 MHz to 10 MHz may be generated. In this case, a frequency band of 1 MHz to 10 MHz may have little effect by a resonance frequency response of the atomic magnetometer 10. An AC resistance wire heating method of the first and second temperature adjustment devices 600 and 700 may significantly reduce a space compared to a typical temperature adjustment method using a heating fluid.

The magnetic shielding part 800 may be implemented to cover the first and second vapor cells 200 and 300, the first and second temperature adjustment devices 600 and 700, the pair of first bias magnetic field generating coils 430, and the pair of second bias magnetic field generating coils 450.

Figure 3:
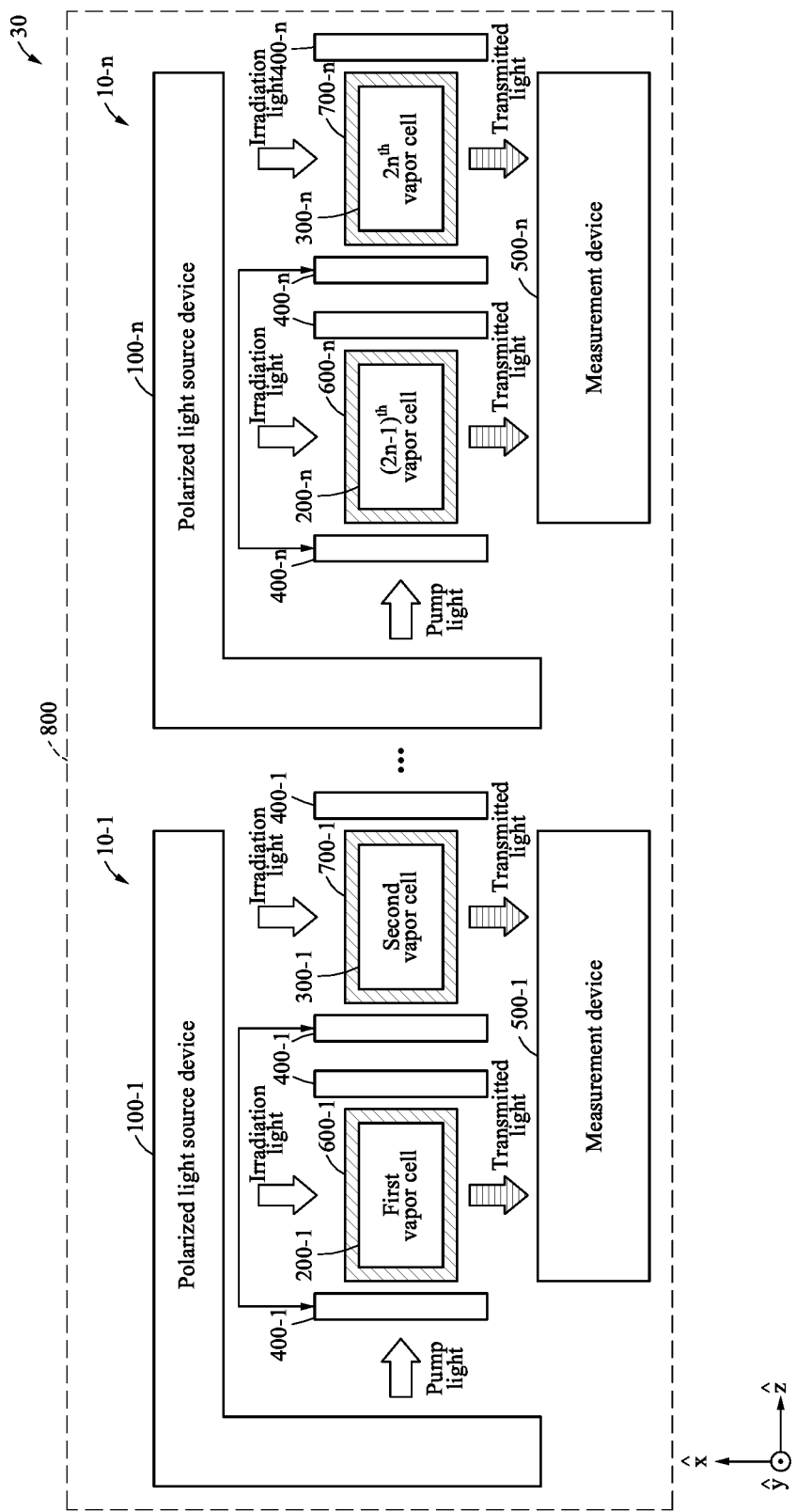
FIG. 3 is a diagram illustrating an atomic magnetometer according to another example embodiment.
Figure 4:
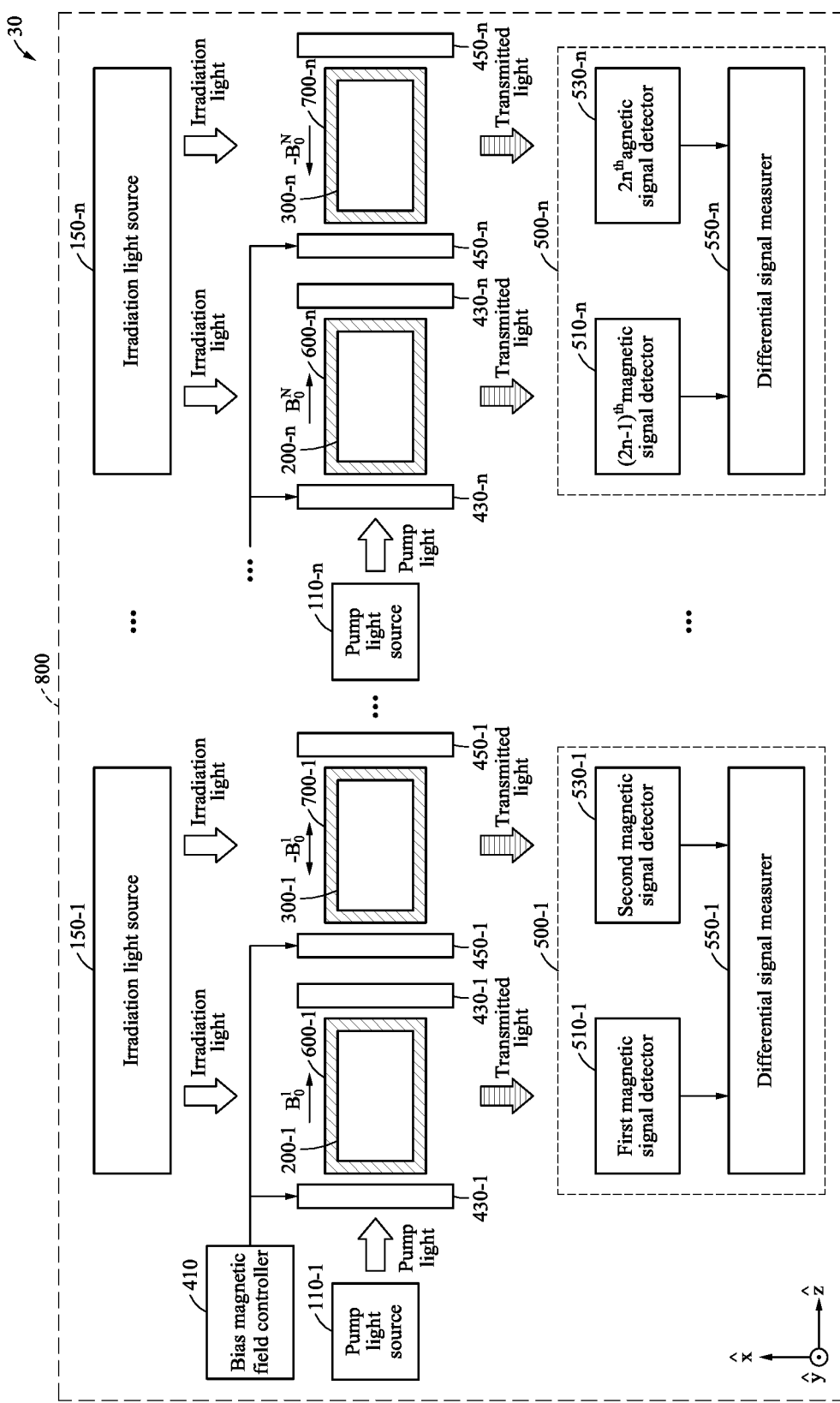
FIG. 4 is a diagram illustrating the atomic magnetometer of FIG. 3.

FIG. 3 is a diagram illustrating an atomic magnetometer according to another example embodiment and FIG. 4 is a diagram illustrating the atomic magnetometer of FIG. 3.

An atomic magnetometer 30 may be implemented by arranging the atomic magnetometer 10 of FIGS. 1 and 2 in a plurality of (n) arrays. Accordingly, a description of operations of atomic magnetometers 10-1 through 10-*n* included in the atomic magnetometer 30 will be omitted.

Bias magnetic fields applied to the atomic magnetometers 10-1 through 10-*n* included in the atomic magnetometer 30 may be applied to have a predetermined difference. The bias magnetic fields applied to the atomic magnetometers 10-1 through 10-*n* may be applied to respective vapor cells such that resonance frequencies of the alkali metal atoms have a difference of several hundred hertz to several kilohertz. In this case, the atomic magnetometer 30 may have a relatively wide measurement frequency bandwidth.

Figure 5:
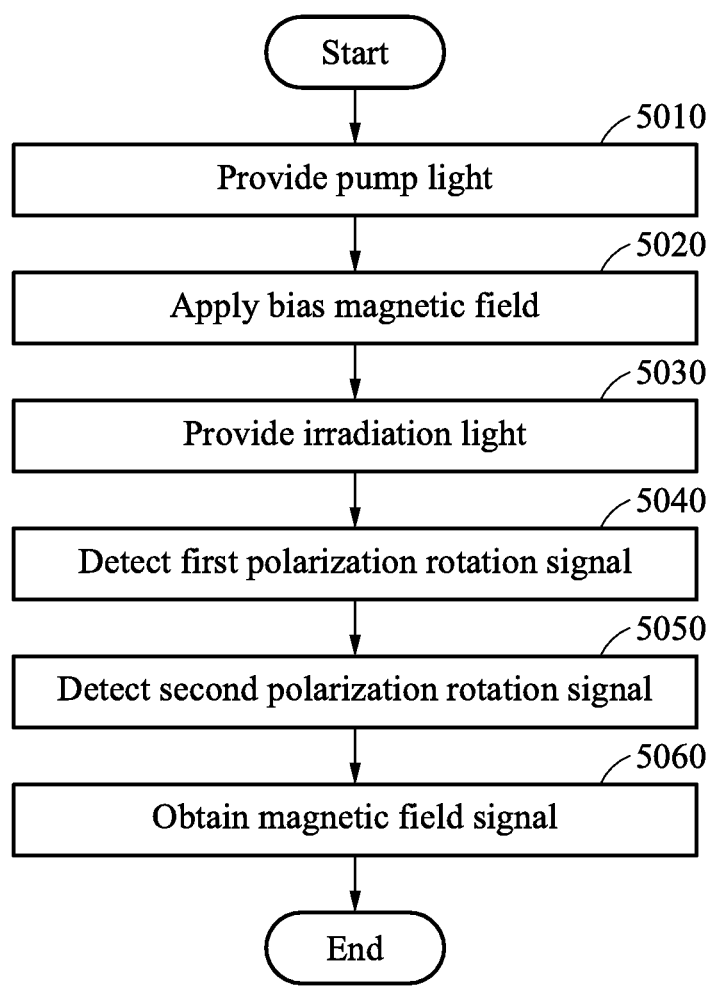
FIG. 5 is a flowchart illustrating an operation method of an atomic magnetometer.

FIG. 5 is a flowchart illustrating an operation method of an atomic magnetometer.

In operation 5010, the operation method may optically pump alkali metal atoms by providing a circularly polarized pump light to the first vapor cell 200 and the second vapor cell 300 including the alkali metal atoms. For example, the circularly polarized pump light may be provided to the first vapor cell 200 and the second vapor cell 300 through the pump light source 110. The linearly polarized irradiation light may be provided to the first vapor cell 200 and the second vapor cell 300 to which a bias magnetic field is applied through the irradiation light source 150. For example, a temperature of the first vapor cell may be adjusted through the first temperature adjustment device 600 located outside the first vapor cell 200. A temperature of the second vapor cell 300 may be adjusted through the second temperature adjustment device 700 located outside the second vapor cell 300.

In operation 5020, the operation method may apply a bias magnetic field in opposite directions to the first vapor cell 200 and the second vapor cell 300 including the optically pumped alkali metal atoms. For example, the bias magnetic field controller 410 may be used to control magnetic fields generated by the pair of first bias magnetic field generating coils 430 located on both sides of the first vapor cell 200 and the pair of second bias magnetic field generating coils 450 located on both sides of the second vapor cell 300.

In operation 5030, the operation method may provide a linearly polarized irradiation light to the first vapor cell 200 and the second vapor cell 300 to which the bias magnetic field is applied.

In operation 5040, the operation method may detect a first polarization rotation signal based on a polarization state of a first transmitted light output by the first vapor cell 200 provided with the linearly polarized irradiation light.

In operation 5050, the operation method may detect a second polarization rotation signal based on a polarization state of a second transmitted light output by the second vapor cell 300 provided with the linearly polarized irradiation light.

In operation 5060, the operation method may obtain a magnetic field signal based on a differentiation of the first polarization rotation signal and the second polarization rotation signal.

The atomic magnetometer 10 may overcome a limitation of a measurement location-based gradiometer that is generally used.

The atomic magnetometer 10 may have a sensitivity comparable to that of a superconducting quantum interference device, not require low-temperature cooling, not consume expensive refrigerants such as helium, use a semiconductor laser having low power consumption, and thus, be inexpensive to maintain.

The atomic magnetometer 10 may have an easily variable measurement frequency band, have a frequency band to be relatively expanded through an arrangement of a plurality of atomic magnetometers 10 and thus, be easily utilized in developing a low-frequency magnetic field communication technology.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The example embodiments described herein may be implemented using hardware components, software components, and/or a combination thereof. For example, the processing device and the component described herein may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter.

The above-described hardware devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. An atomic magnetometer for measuring a magnetic field signal, the atomic magnetometer comprising:
   a light source device configured to output a linearly polarized irradiation light and a circularly polarized pump light;
   a first vapor cell comprising an alkali metal atom magnetically polarized by the circularly polarized pump light, receiving the linearly polarized irradiation light, and outputting a first transmitted light;
   a second vapor cell comprising an alkali metal atom magnetically polarized by the circularly polarized pump light, receiving the linearly polarized irradiation light, and outputting a second transmitted light;
   a magnetic field application device configured to apply a bias magnetic field in opposite directions to the first vapor cell and the second vapor cell; and
   a measuring device configured to obtain the magnetic field signal based on a differentiation of a first polarization rotation signal corresponding to a polarization state of the first transmitted light and a second polarization rotation signal corresponding to a polarization state of the second transmitted light.

2. The atomic magnetometer of claim 1, wherein the light source device comprises:
   a pump light source configured to output the circularly polarized pump light; and
   an irradiation light source configured to output the linearly polarized irradiation light.

3. The atomic magnetometer of claim 1, wherein the alkali metal atom is any one of potassium (K), rubidium (Rb), and cesium (Cs).

4. The atomic magnetometer of claim 1, wherein the first vapor cell and the second vapor cell further contain a buffer gas.

5. The atomic magnetometer of claim 4, wherein the buffer gas is a quenching gas using any one of helium (He), xenon (Xe), and nitrogen (N).

6. The atomic magnetometer of claim 1, further comprising:
   a first temperature adjustment device configured to adjust a temperature of the first vapor cell and located outside the first vapor cell; and
   a second temperature adjustment device configured to adjust a temperature of the second vapor cell and located outside the second vapor cell.

7. The atomic magnetometer of claim 1, wherein the magnetic field application device comprises:
   a pair of first bias magnetic field generating coils located on both sides of the first vapor cell to apply a bias magnetic field to the first vapor cell;
   a pair of second bias magnetic field generating coils located on both sides of the second vapor cell to apply a bias magnetic field to the second vapor cell; and
   a bias magnetic field controller configured to control magnetic fields generated by the pair of first bias magnetic field generating coils and the pair of second bias magnetic field generating coils.

8. The atomic magnetometer of claim 1, wherein a direction of the bias magnetic field is parallel to a magnetic polarization direction of the alkali metal atom.

9. The atomic magnetometer of claim 1, wherein the magnetic field signal is circularly polarized and output in an antenna.

10. An operation method of an atomic magnetometer for measuring a magnetic field signal, the method comprising:

optically pumping alkali metal atoms by providing a circularly polarized pump light to a first vapor cell and a second vapor cell comprising the alkali metal atoms;

applying a bias magnetic field in opposite directions to the first vapor cell and the second vapor cell comprising the optically pumped alkali metal atoms;

providing a linearly polarized irradiation light to the first vapor cell and the second vapor cell to which the bias magnetic field is applied;

detecting a first polarization rotation signal based on a polarization state of a first transmitted light output by the first vapor cell provided with the linearly polarized irradiation light;

detecting a second polarization rotation signal based on a polarization state of a second transmitted light output by the second vapor cell provided with the linearly polarized irradiation light; and obtaining the magnetic field signal based on a differentiation of the first polarization rotation signal and the second polarization rotation signal.

11. The operation method of claim 10, wherein the optically pumping comprises providing a circularly polarized pump light to the first vapor cell and the second vapor cell through a pump light source, and the providing of the irradiation light comprises providing a linearly polarized irradiation light to the first vapor cell and the second vapor cell to which the bias magnetic field is applied through an irradiation light source.

12. The operation method of claim 10, wherein the alkali metal atoms are any one of potassium (K), rubidium (Rb), and cesium (Cs).

13. The operation method of claim 10, wherein the first vapor cell and the second vapor cell further contain a buffer gas.

14. The operation method of claim 13, wherein the buffer gas is a quenching gas using any one of helium (He), xenon (Xe), and nitrogen (N).

15. The operation method of claim 10, further comprising:
adjusting a temperature of the first vapor cell through a first temperature adjustment device located outside the first vapor cell; and
adjusting a temperature of the second vapor cell through a second temperature adjustment device located outside the second vapor cell.

16. The operation method of claim 10, wherein the applying of the bias magnetic field comprises:
controlling, through a bias magnetic field controller, magnetic fields generated by a pair of first bias magnetic field generating coils located on both sides of the first vapor cell and a pair of second bias magnetic field generating coils located on both sides of the second vapor cell.

17. The operation method of claim 10, wherein a direction of the bias magnetic field is parallel to a magnetic polarization direction of the alkali metal atoms.

18. The operation method of claim 10, wherein the magnetic field signal is circularly polarized and output in an antenna.

* * * * *